(12) United States Patent
Zhang et al.

(10) Patent No.: US 7,795,691 B2
(45) Date of Patent: Sep. 14, 2010

(54) SEMICONDUCTOR TRANSISTOR WITH P TYPE RE-GROWN CHANNEL LAYER

(75) Inventors: Qingchun Zhang, Cary, NC (US); Sarah Haney, Apex, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 3 days.

(21) Appl. No.: 12/019,690

(22) Filed: Jan. 25, 2008

(65) Prior Publication Data
US 2009/0189228 A1      Jul. 30, 2009

(51) Int. Cl.
*H01L 29/78*     (2006.01)
(52) U.S. Cl. .................. 257/402; 257/330; 257/331
(58) Field of Classification Search .......... 257/262, 257/368–401, E29.255–E29.313, E29.315–E29.316; 438/135, 151, 197, 199, 201, 207, 216
See application file for complete search history.

(56) References Cited

U.S. PATENT DOCUMENTS

| | | | |
|---|---|---|---|
| 5,905,284 A | 5/1999 | Fujii et al. | |
| 6,365,932 B1 | 4/2002 | Kouno et al. | |
| 6,455,892 B1* | 9/2002 | Okuno et al. | 257/328 |
| 6,956,238 B2 | 10/2005 | Ryu et al. | |
| 6,995,397 B2* | 2/2006 | Yamashita et al. | 257/77 |
| 7,041,559 B2 | 5/2006 | Baliga | |
| 2002/0038891 A1* | 4/2002 | Ryu et al. | 257/350 |
| 2004/0079989 A1 | 4/2004 | Kaneko et al. | |
| 2004/0084724 A1 | 5/2004 | Kapels et al. | |
| 2006/0270103 A1 | 11/2006 | Das et al. | |
| 2007/0018199 A1* | 1/2007 | Sheppard et al. | 257/200 |
| 2007/0138548 A1* | 6/2007 | Kocon et al. | 257/336 |

FOREIGN PATENT DOCUMENTS

| | | |
|---|---|---|
| EP | 0 653 786 A2 | 5/1995 |
| EP | 0 744 769 A2 | 11/1996 |
| EP | 0 789 401 A2 | 8/1997 |
| EP | 1 286 398 | 2/2003 |
| JP | 20011094097 | 4/2001 |
| WO | WO 0229900 A2 | 4/2002 |

OTHER PUBLICATIONS

European Search Report of counterpart application No. EP 09151203.8 mailed Aug. 19, 2009; 2 pages.

* cited by examiner

*Primary Examiner*—Wai-Sing Louie
*Assistant Examiner*—Sue Tang
(74) *Attorney, Agent, or Firm*—Withrow & Terranova, P.L.L.C.

(57) ABSTRACT

The invention is a device for controlling conduction across a semiconductor body with a P type channel layer between active semiconductor regions of the device and the controlling gate contact. The device, often a MOSFET or an IGBT, includes at least one source, well, and drift region. The P type channel layer may be divided into sections, or divided regions, that have been doped to exhibit N type conductivity. By dividing the channel layer into regions of different conductivity, the channel layer allows better control over the threshold voltage that regulates current through the device. Accordingly, one of the divided regions in the channel layer is a threshold voltage regulating region. The threshold-voltage regulating region maintains its original P type conductivity and is available in the transistor for a gate voltage to invert a conductive zone therein. The conductive zone becomes the voltage regulated conductive channel within the device.

42 Claims, 7 Drawing Sheets

SEMICONDUCTOR TRANSISTOR WITH P TYPE RE-GROWN CHANNEL LAYER

BACKGROUND

The invention relates to the field of semiconductor transistors utilizing a voltage applied to a gate contact to control current in a conductive channel. The device disclosed herein is particularly useful in the art of power transistors that operate in a wide range of temperatures. Transistors formed by the new method include a regrown P type epitaxial layer for the channel layer and thus exhibit better control at room temperature or even elevated temperatures.

Numerous efforts have been underway to develop silicon carbide MOSFETs using conventional DMOS (double diffused metal-oxide-semiconductor) structures with an N type regrown channel that improves channel mobility. The presence of the N type regrown channel causes inherent fluctuations in device performance because the threshold voltage shifts with operating conditions. Research shows that the varying threshold voltage results, at least in part, from scattered carriers distributed through the device during manufacturing steps, such as during channel layer regrowth, N type ion implantation, dopant activation, etc. In general, the N type regrown layer reduces the threshold voltage by about 1 volt as compared to standard transistors with no regrown channel layer. This change in threshold voltage leads to undesirable variations in conduction at both room temperature and elevated temperatures.

The innovative features of this invention are useful in several different semiconductor devices and are particularly effective in MOSFET designs. Commonly assigned U.S. Pat. No. 6,956,238 (Ryu 2005) sets forth a significant list of literature describing the history, structure, and performance characteristics of power MOSFETS. The Ryu '238 patent is incorporated by reference as if fully set forth herein. Generally, power MOSFETs utilize a gate contact to control conductivity in the semiconductor channel of the device. When the voltage on the gate is sufficiently high, the transistor will conduct large currents from source to drain so long as the appropriate inversion layer allows carriers from the source to cross into the drift region of the device.

Numerous efforts have been taken to develop SiC MOSFETs using conventional techniques, such as double diffusion. FIG. 1 shows an example. These appropriately named DMOSFETs (double diffused metal oxide semiconductor field effect transistors) include P type wells (12, 14) surrounding an N type source (16, 17) (or the opposite conductivity types depending on the type of device). For current to flow from source (16, 17) to drain (20) across a drift region (22), the traditional DMOSFETs (10) require a sufficient voltage on the gate contact (24) atop an oxide layer (26) to invert a channel region (28) in the P type well (12, 14) so that N type carriers from the source (16, 17) can traverse the wells (12, 14), cross the conductive drift region (22), and form a large current on the drain contact (20). See Prior Art FIG. 1.

As set forth in the Ryu '238 patent of the prior art, the p-wells of a DMOSFET are semiconductor regions implanted with aluminum or boron, and the source region is implanted with nitrogen or phosphorus. The implants are activated at temperatures between 1400° C. to 1700° C. The contacts to N+ layers are annealed layers of nickel (Ni) while the contacts to the P+ regions of the device would be nickel (Ni), titanium (Ti), or an alloy of titanium and aluminum (Ti/Al). A dielectric layer, such as silicon nitride or silicon dioxide, separates the gate contact from the semiconductor layer of the transistor. See U.S. Pat. No. 6,956,238 (Ryu, 2005) (Col. 2, Lines 44-55). Ryu notes (col. 2, lines 58-65) that one problem with DMOSFETs is poor mobility in the inversion layer, leading to very high on-resistance.

Ryu '238 previously alleviated this high on-resistance to a certain extent by forming a thin layer of silicon carbide over the well regions surrounding the source. This thin layer (26) is doped to N type conductivity with nitrogen or phosphorus and extends from the source region to the drift region. The thin semiconductor layer (26) provides a shorting channel for carriers from the source to traverse the well region, thereby enhancing conduction from source to drain. See Ryu '238 (col. 11, lines 33-38). In a different embodiment, Ryu utilizes a regrown epitaxial layer that is grown over the P type wells and extends across the drift region. See Ryu '238 (col. 12, lines 8-36). In this embodiment of Ryu's device, the regrown silicon carbide layer is undoped.

Ryu's silicon carbide regrown layer has a thickness from about 0.05 microns to about 1 micron, but a thinner layer of between about 1000 and 5000 angstroms is preferred. According to Ryu, the thin, N type shorting channels and regrown layers self deplete the channel at zero bias to prevent unwanted conduction in the off state. These layers also provide a low resistance route for source carriers to aid the inversion layer in providing conduction to the drain. Furthermore, the regrown layer reduces the surface roughness created by implant activation annealing. In this regard, the conductive channel is positioned in the epitaxial layer for better conductivity. See Ryu '238, col. 12, lines 30-35.

Ryu has achieved considerable advancement in controlling the zero bias state and preventing conductivity at that point while also providing a low on-resistance under forward biasing. Still, however, the presence of the N type regrown channel layer (26) causes fluctuation in the threshold voltage that turns on the device, partly because temperature variations affect channel depletion in the shorting channels and regrown layer. Interface states and electron scattering, natural results of Ryu's ion implantation and activation, further complicate the unpredictable threshold voltage in devices with Ryu's regrown layer. In fact, an N type regrown layer may reduce threshold voltage by as much as 1 V as compared to devices with no regrown layer. Accordingly, devices with an N type regrown layer may exhibit unwanted forward conduction at room temperature or other operating temperatures, even at zero gate bias.

Attempts to control threshold voltage, even in devices used at various operating temperatures, have previously manipulated the structural features of the conductive channel. For instance, U.S. Pat. No. 5,905,284 (Fuji, 1999) discusses the fact that as gate oxide films between the gate and the transistor body become increasingly thinner with device miniaturization, the gate impurities diffuse into the channel, causing unwanted conduction at zero gate bias. (Fuji, col. 2, lines 17-22). Fuji notes that one remedy to this problem may be found in forming the gate oxide films and gate contacts discretely, which, of course leads to higher manufacturing costs. Fuji then suggests a method of forming the diffusively doped regions in the transistor in defined layers with varying annealing temperatures and different angles of dopant implantation. (col. 4, lines 28-40; col. 13, lines 1-15).

In a different technique for ensuring the integrity of a device threshold voltage at operating temperatures, Han et al. show that the doping profile of the source is another way to manage conductivity in the channel. See EP 0744769 A2 (col. 10, lines 3-29). In Han's FIG. 5, as the phosphorus concentration in the channel decreases, the latch current density steadily increases, but the latch does not occur when the phosphorus doping is less than $5 \times 10^{18}$ cm$^{-3}$. All the while, forward current density decreases only slightly, further adding to Han's positive result. For general purposes, Han shows that as the phosphorus concentration decreases along the surface of the source, the size of the source is reduced vertically in Han's FIG. 1, so the length of the channel is increased. The P+ polarity in the channel is also increased, thereby maintaining a higher than expected threshold voltage. See Han '769 (col. 10, lines 25-30).

Even with Ryu's advances in increasing channel efficiency with regrown N type layers and other efforts in this area, a need still exists in the art of power electronics for a transistor with high conductivity in the channel without the corresponding deterioration in threshold voltage. Other attempts to manage the threshold voltage characteristics of power transistors require manipulating the source to an extent that maximum conductivity cannot be achieved. Accordingly, there exists a persistent need in the art for a power transistor with low on resistance, high channel conductivity, and a reliable threshold voltage even at a wide range of operating temperatures.

BRIEF SUMMARY OF THE INVENTION

The invention is a device for controlling electrical conduction across a semiconductor body having a P type channel layer that is divided into sections, or regions, of varying conductivity type and doping level. The device, often a MOSFET (30) or an IGBT (65), includes at least one source region (38, 78) within the semiconductor body, the source region (38, 78) having a first conductivity type. The source region is surrounded by at least one well region (33, 34, 83, 84) having a second conductivity type to control carrier flow from the source region to a collector (42, 82). A drift region (54, 89) provides a conductive path adjacent the side of the well region (33, 34, 83, 84) opposite the source region (38, 78), the drift region (54, 89) having the first conductivity type, typically of a lower doping level N−. The P type channel layer (46, 66), as set forth in this invention, is positioned on at least a portion of the source, well, and drift regions, to provide a conductive path across the well region to the drift region. As noted herein, the channel layer (46, 66) has a region, or divided section (56, 57, 58, 60, 70-73), of a first conductivity type adjacent the source region and a region, or section, of the second conductivity type adjacent the well region. A control contact (45, 85) on the channel layer (46, 66) regulates the current from the source across the drift region to the drain, or collector contact (42, 82).

A MOSFET formed in accordance with this invention includes a semiconductor body that maintains a normally off status at operating temperature such that conduction from the source region (38) is minimized until a threshold voltage is applied to the MOSFET. Up to the point of reaching a desired threshold voltage applied to the gate, the carriers from the source region are restrained from conduction by at least one well region (33, 34) having an opposite conductivity type as the source region (38). The well region (33) closest to the channel layer may have a retrograde doping profile such that the conductivity decreases from bottom to top. This doping type forms a retrograde layer (31) closest to the channel layer (46). It follows then, that according to one embodiment of this invention, the MOSFET includes a channel layer (46) formed on the MOSFET semiconductor body to electrically connect the source region (38) to a conductive drift region (54) within the semiconductor body.

The channel layer (46) in the claimed MOSFET includes a first channel layer region (56) positioned within the channel layer (46) and having the same conductivity type as the source region (38). The first channel layer region (56) extends across at least a portion of the source region (38). A threshold voltage regulating region (58) within the channel layer (46) and proximate the first channel layer region (56), has the opposite conductivity type as the source region (38) to control the threshold voltage that allows conduction across the channel layer (46). The threshold voltage regulating region (58) is positioned proximate the first channel layer region (56) and extends across at least a portion of the well region (33). A control contact (45) on the channel layer (46) controls current flowing from the source region through the channel layer.

The P type channel layer (46, 66) of this invention may be positioned between two different components of the device: (i) the layer incorporating source (38, 78) and drift regions (54, 89) and (ii) the insulator material (52, 76) supporting the gate contact (45, 85). By dividing the channel layer (46, 66) into sections, or regions, the channel layer (46, 66) allows better control over the threshold voltage that regulates current from source to drain or, similarly, from emitter to collector. Accordingly, one of the channel layer regions in the claimed channel layer of this invention is a threshold voltage regulating region (58, 72).

The P type channel layer (46, 66) may be incorporated into a number of transistors and other semiconductor devices in which current control is desirable. The invention, therefore, includes a method of forming a semiconductor device that has the P type channel layer (46, 66) with sections, or regions (56, 57, 58, 60, 70-73), therein that have been doped to N type conductivity. The method includes the steps of (i) implanting at least one P type well (33, 34, 83, 84) into an N type semiconductor body to depths that define at least one N type source region (38, 78) at least partially surrounded by the P type well (33, 34, 83, 84); (ii) doping the N type source region (38, 78) to form an N+ type source region; (iii) growing a P type channel layer (46, 66) over at least a portion of both said well and said source region; (iv) doping sections of said P type channel layer to convert the sections to N type channel layer regions, said N type channel layer regions abutting opposite sides of at least one P type section of said channel layer; and (v) forming a gate contact (45, 85) on the channel layer, the gate contact at lease partially covering at least one N type channel layer region and at least one P type channel layer region. These steps, enumerated here only for clarity, may be accomplished in other orders, with intervening steps for added efficiencies, and may utilize common techniques available for processing semiconductor materials.

DETAILED DESCRIPTION

Figure 1:
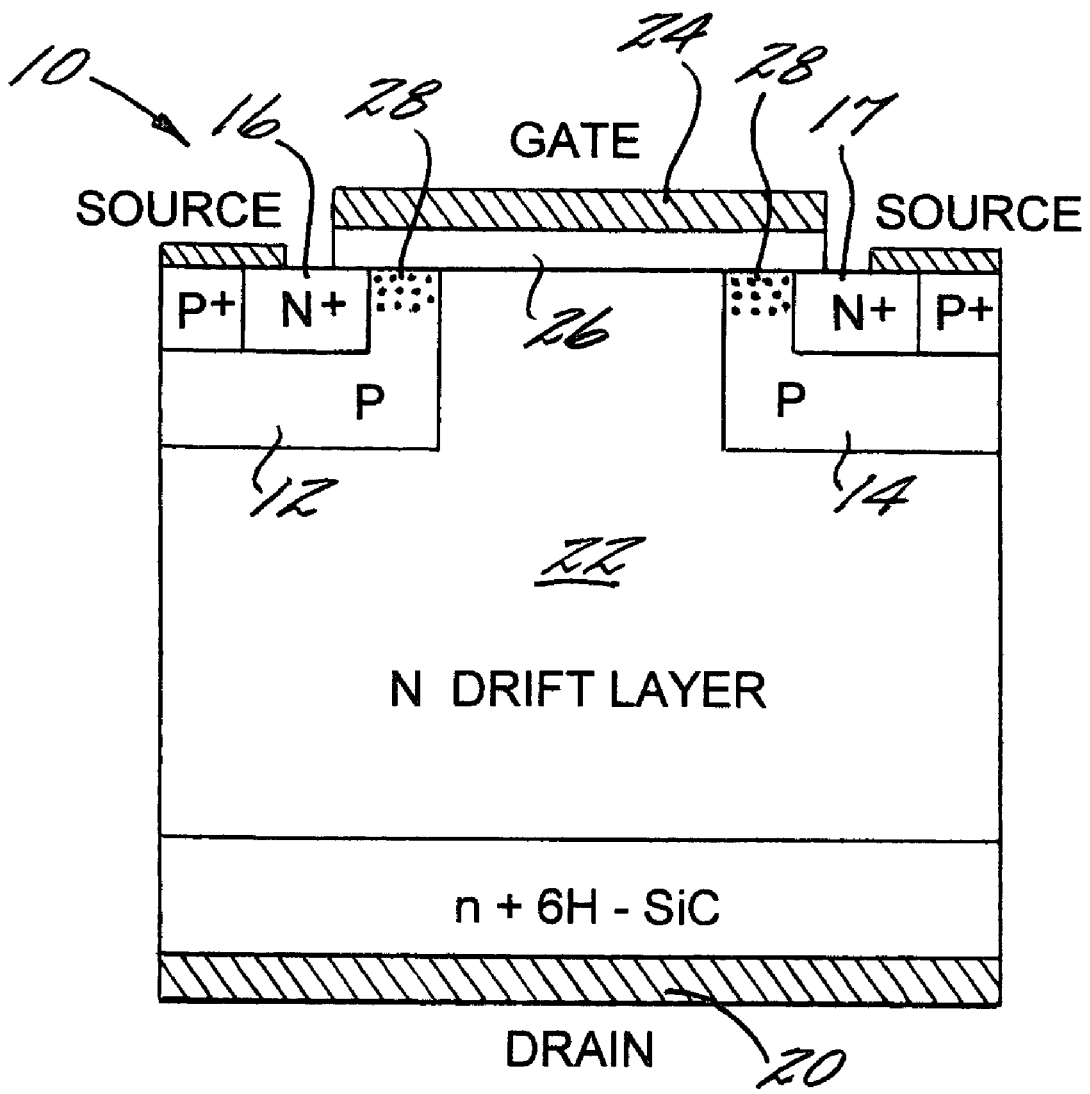
FIG. 1 is a prior art MOSFET having an N type channel layer.

The invention is a device for controlling electrical conduction across a semiconductor body, particularly useful for metal-oxide-semiconductor field effect transistors (MOSFETs) (30), insulated gate bipolar transistors (IGBTs) (65), and other semiconductor devices used in power applications across a wide range of temperatures. The transistors disclosed herein incorporate a new P type regrown channel layer (46, 66) over the P type well (33, 83) that surrounds the transistor source region (38, 78).

This detailed description should not limit the invention to literal terms. For example, terms describing relative position of elements in this invention should be given their broadest meaning unless otherwise noted. For example, when a transistor element or layer is located "on" another layer, "beside" another element, or "adjacent" or "proximate" a certain part of the device at hand, that terminology suggests that intervening parts of the device may be present between the recited elements if necessary. When a layer is "directly adjacent" or "directly beside" another element, the term typically indicates that there are no intervening elements there between.

Those having skill in the art will recognize that the invention may be embodied in many different types of transistors device structures. Accordingly, the invention is not limited to the particular structures illustrated herein. For example, transistors may include a P type or N type channel, depending upon configuration. Any layer or transistor region described herein may have an opposite doping type as that used here, as the descriptions used in this document are for example only. When the device is described as a "semiconductor device," such terminology includes all possible materials, including but not limited to silicon, silicon carbide, Group III nitride compounds, alloys of other semiconductor materials, and the like.

As noted above, each embodiment of this invention utilizes a channel layer that has different doping characteristics from one region of the channel layer to other regions of the same layer. The overall layer is referred to herein as the channel layer (46), but the variously doped regions within the channel layer (46) are identified by their individual doping characteristics or their function. For example, a P type region in the channel layer (46) may be considered simply a P type channel layer region, or more precisely as the threshold voltage regulating region due to the fact that the channel conductivity is determined by that P type portion of the channel layer (46). In any event, the doped sections of the channel layer (46) together define a single layer of the device.

In a first embodiment, the transistor device (35) controls conduction across a semiconductor body from a source (38) to a drain or collector (42). The gate contact (45) inverts the P type region (58) and forms a conductive channel zone (50) in the device for carriers to flow from the source (38) through the drift region (54) to the collector (42). The transistor embodiment of this invention includes a regrown channel layer (46) of which the P type region (58) forming the channel (50) is a part. Embodiments of this invention include, but are not limited to, MOSFETs, insulated gate bipolar transistors (IGBTs), and MOS controlled thyristors.

Devices incorporating the regrown channel layer (46) described herein typically control electrical conduction across a semiconductor body. Controlled conduction across the semiconductor utilizes carriers from at least one source region (38) within the semiconductor body having a first conductivity type. To ensure a proper threshold voltage to regulate conduction for various applications, the transistors (30) utilizing this invention include at least one well region (33, 34) having a second conductivity type and located sufficiently close to the source region (38) to control the current emanating from the source (38). The drift region (54) is adjacent the side of at least one of the well regions (33, 34) and opposite the source region (38). The drift region (54) has the same first conductivity type as the source (38) for providing a conductive path for carriers from the source region (38).

Figure 2:
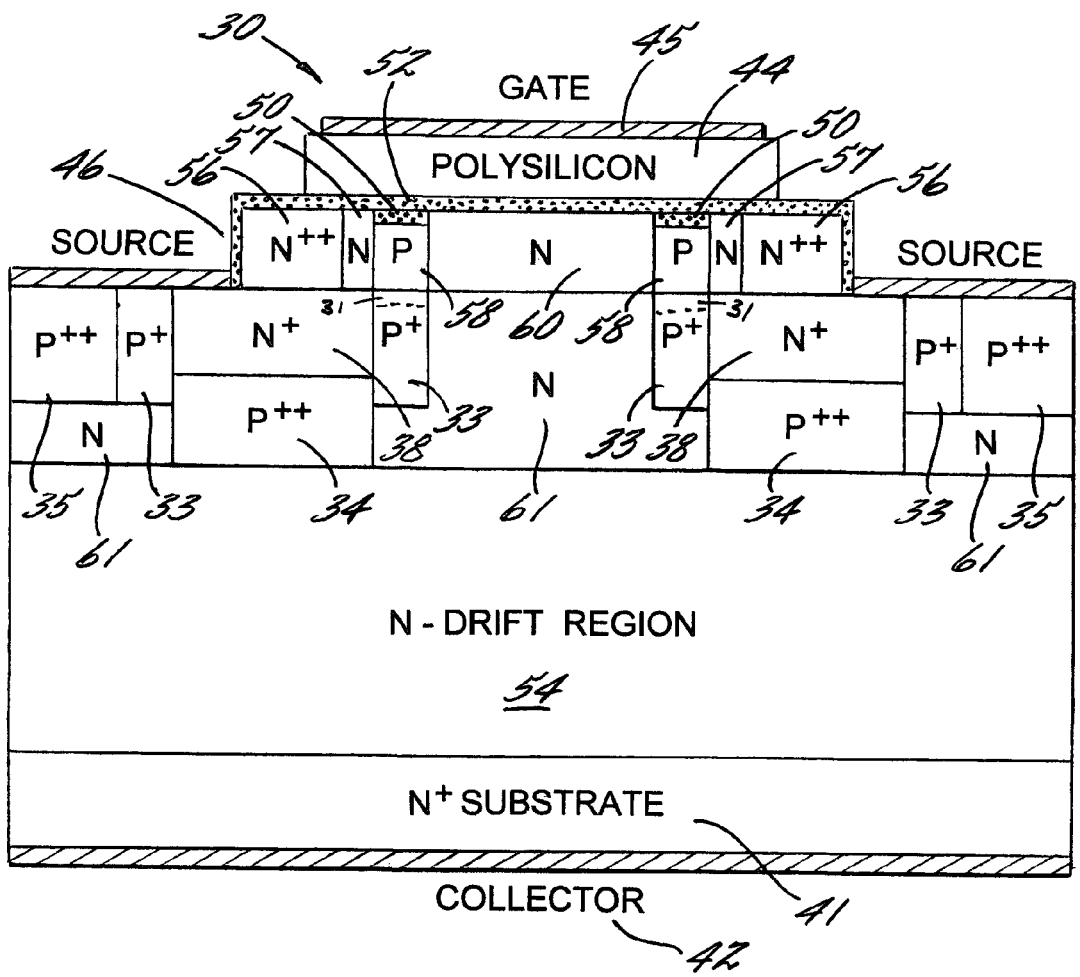
FIG. 2 is a MOSFET formed in accordance with this invention and having a P type channel layer in which regions therein are doped to N type conductivity.

One aspect of this invention that has yet to be shown in prior transistors is that of a channel layer (46) having sections (56, 57, 58, 60) of opposite conductivity type adjacent one another. The channel layer (46) extends across the device (30) and is positioned on at least a portion of the source (38), well (33, 34), and drift regions (54). The channel layer (46) thereby provides a conductive path across the well region (33) to the drift region (54). As shown in FIG. 2, the channel layer (46) has a first conductivity type section (56, 57) adjacent the source region (38) and a second conductivity type section (58) adjacent the well region (33).

In certain commonly used embodiments, the transistor (30) formed according to this invention includes a control contact (45) on the channel layer (46) for controlling the current from the source (38) and across the drift region (54). In the MOSFET of FIG. 2, the control contact is a gate contact (45) that includes a metal layer (45) atop a layer of polysilicon (44). The gate contact of FIG. 2 may be formed by numerous methods that are well known in the art.

Unlike regrown channel layers of the prior art discussed above (FIG. 1), the regrown channel layer (46) of this invention may be formed initially of a semiconductor material having the opposite conductivity type as the source region (38). For example, and without limiting the scope of the invention herein, devices utilizing N type source regions (38) benefit from the epitaxial growth of a P type regrown channel layer (46). In general, devices using P type regrown channel layers (46) exhibit a higher threshold voltage than counterpart devices using the N type regrown channel of the prior art (FIG. 1). The higher threshold voltage provides greater assurance that the device (30) will be normally off at a gate (45) bias of zero volts for all operation temperatures. Simulation results have shown that a P type regrown channel layer (46) yields a threshold voltage increase of more than 1 V at room temperature, a good indication that the device (30) will be stable in ordinary operating conditions.

In one embodiment, therefore, the invention is a device for controlling conduction across semiconductor layers via a P type epitaxially grown channel layer (46) with a doping concentration between about $1 \times 10^{16}$ atoms/cm$^{-3}$ and about $5 \times 10^{16}$ atoms/cm$^{-3}$. The P type channel layer (46) may be epitaxially grown on the semiconductor body (e.g., the transistor drift region (54)) with a non-uniform doping concentration across the thickness of the regrown channel layer. The non-uniform doping concentration may encompass designs in which the regrown channel layer (46) has a higher doping concentration along the boundary of the drift region (54) than the doping concentration of that portion of the regrown channel layer (46) closest to the control, or gate, contact (45). The non-uniform doping concentration may have a doping profile that is of any desirable configuration, such as a delta (δ) shaped doping profile.

The doping level of each region of the device is tailored to the use at hand. In a preferred embodiment, the source (38) is highly doped N type (N++) and the well region has at least one portion that is highly doped P type (P++) (34). The well region surrounding the source region may include more than one doping level. For instance, device performance increases when the well region controls conduction from the source with a P+ well (33) on either side of the source (38) and a P++ well (34) below the source (38). In this embodiment, the N type source (38) is surrounded by P type well regions of varying but effective doping levels.

Figure 3:
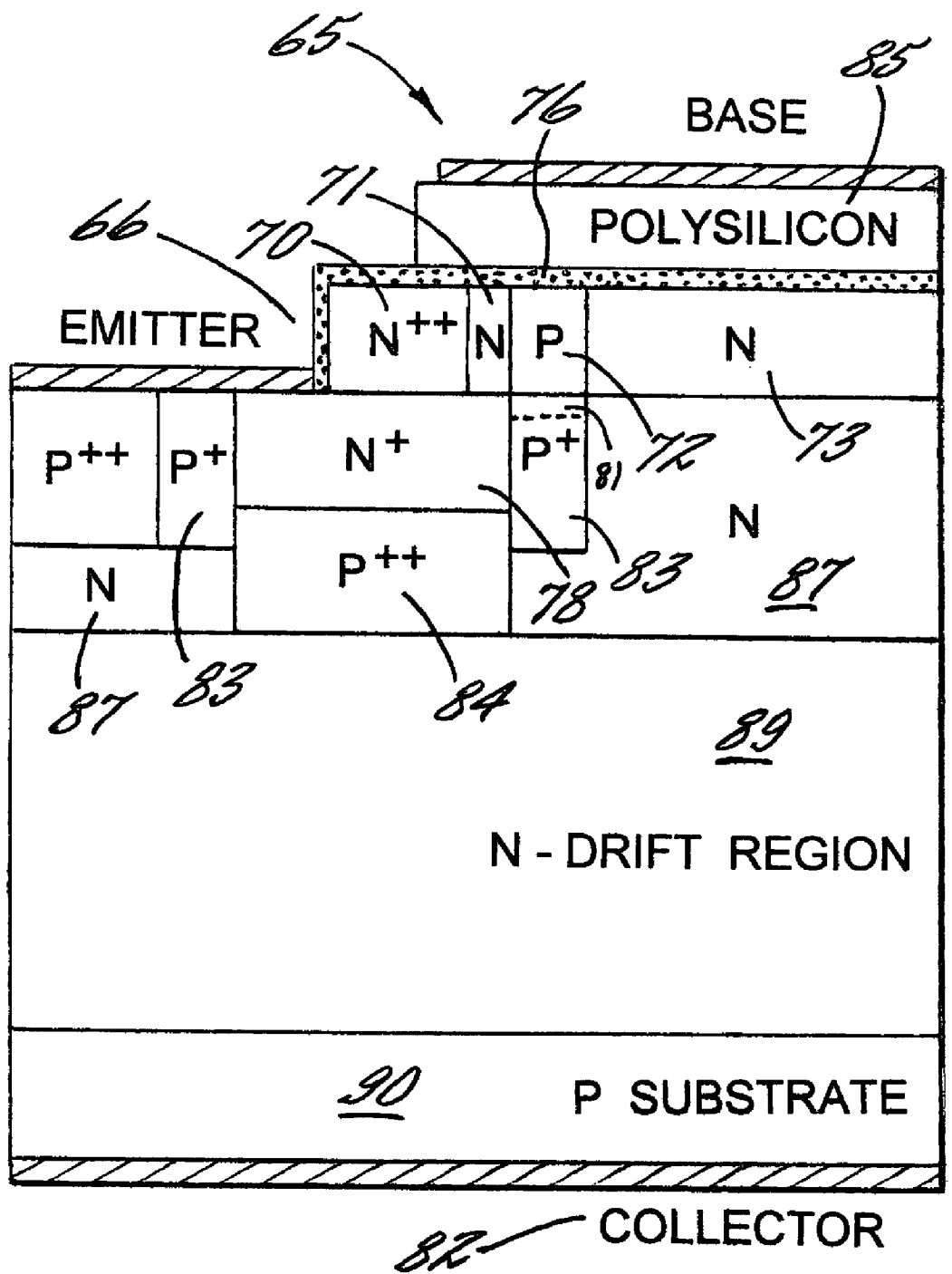
FIG. 3 is an IGBT formed in accordance with this invention and having a P type channel layer in which regions therein are doped to N type conductivity.

The P+ well regions (33) may be formed using implantation techniques in which the doping profile is generally a box profile with relatively consistent doping from bottom to top. In an additional embodiment, the P+ well regions (33) may utilize doping techniques such as "retrograde to the surface" or "buried implantation." In this embodiment, the retrograde profile includes a p-type doping concentration that decreases from the bottom of the well toward the top of the well (i.e., from the portion of the well (33, 83) closest to the drift region (54) toward the portion of the well closest to the regrown channel layer (46)). With the P+ well (33) doping characterized by a retrograde profile, it is possible that the top region (31) of the P+ well (33) will actually be of n-type conductivity. FIGS. 2 and 3 show these optional top regions (31, 81) of the P+ well beginning at the dotted line therein.

It is within the scope of the devices disclosed herein to utilize either the box profile, buried implantation, or retrograde to surface configurations for the P+ wells (33, 83). By using the retrograde profile that includes decreasing p-type carrier levels from the bottom of the P+ well (33) toward the top of the P+ well (33), the device has reduced crystal damage on the surface of the well (33) because surface implantation has been reduced or even eliminated. The retrograde profile further thickens the inversion channel region (58), referred to herein as the P type threshold voltage regulating portion (58), to include not only region (58) from the regrown p-type layer but also the top region (31) of the P+ well (33). The same is true for the IGBT embodiment of FIG. 3. This technique significantly reduces the device channel resistance.

The invention disclosed herein adds further control features to the regrown channel layer (46) by dividing the P type regrown channel layer (46) into sections (56, 57, 58, 60) of different conductivity types. These variously doped sections of the channel layer (46) are referred to herein as channel layer regions (56, 57, 58, and 60). Given the fact that the channel layer (46) is divided into regions (56, 57, 58, and 60), the gate contact (45) voltage inverts only a portion, referred to as the channel zone (50), of a P type regrown channel layer section (58) proximate an N type source (38). In the channel layer (46) of FIG. 2, the N+ source (38) provides carriers for conduction from the source (38), through N type channel layer regions (56, 57) to the channel zone (50) of the P type channel layer region (58). At that point, the carriers are swept across the drift region (54) toward the collector (42).

The separately doped channel layer regions (56, 57, 58, 60) add an additional level of control that allows the voltage on the gate (45) to manipulate accurately the magnitude of the current conducting through the device (30). As described above, the channel layer (46) preferably starts with an opposite conductivity type as the source region (38). In the device of FIG. 2, the channel layer (46) is an epitaxially-grown P type semiconductor layer. Regions of the P type channel layer (46) are doped to varying levels of N type conductivity to accomplish the voltage control desired for purposes herein. In FIG. 2, the channel layer regions range from N++ type (56) to N type (57) to P type (58) and back to N (60). As shown in FIG. 2, each side of the device may have symmetrical doping schemes. One design for the channel layer (46) includes divided regions with sufficient doping to form a P type channel layer region (58) surrounded by N type regions (56, 57, 60) with varying doping levels that can be tailored for the use at hand. The P type divided channel layer region (58) provides an additional amount of control to the threshold voltage necessary for carriers to cross the P type channel layer region (58) and allow conduction through the device. The threshold voltage must be sufficient to invert a portion of the P type channel layer region (58) and form a conductive channel zone (50) there through. Upon establishment of a conductive channel zone (50), the carriers from the source (38) traverse the channel layer (46), thereby escaping the wells (33, 34). The N++ divided channel layer region (56) and N type channel layer region (57) extend over at least a portion of the source (38) and provide additional carriers across the conductive channel (50).

Additional design details may be incorporated into the device (30) of FIG. 2 depending upon the use at hand. Without limiting the invention or the devices that may incorporate any part of the invention, the overall devices that control current typically incorporate layers of semiconductor material that are epitaxially grown on a substrate. An exemplary device includes a silicon carbide substrate (41) with a collector contact (42) on one side and an epitaxially-formed semiconductor drift region, or drift layer, (54) on the other side. The drift region may be of N– conductivity type. By implanting P type dopants, the layer on the drift layer (54) includes at least one P++ well region (34) and at least one P+ well region (33), both of which at least partially surround an N+ source region (38) formed by implanting dopants in the semiconductor region on the P++ well region (38). P++ type junction termination wells (35) are located beside the respective well regions on either side of the device (30). The channel layer (46) is positioned on the doped epitaxial layer that includes the source (38), wells (33, 34), and a portion of the drift region (54). This upper portion of the drift region may be an epitaxial layer (61) that forms the JFET region of the transistor and is N type conductivity. A gate insulator (52), such as silicon dioxide or other passivating material, covers the channel layer (46) and forms a region on which the gate contact (45) may be formed.

As is often used in technology of the type, the different portions of the device may be doped to any doping range that allows functional control of the conduction from the source (38) to the collector (42). For example only, and without limiting the doping ranges that may be used, the device of FIG. 2 may have a substrate (41) doped to N+ type conductivity with a doping level of about $5 \times 10^{18}$ atoms/cm$^{-3}$. The source region (38) is an N+ type source region doped to a level of about $1 \times 10^{20}$ atoms/cm$^{-3}$. The wells (33, 34) around the source region (38) include at least one P+ type well section (33) doped to a level of about $5 \times 10^{18}$ atoms/cm$^{-3}$ and a P++ type well section (34) doped to a level of about $5 \times 10^{19}$ atoms/cm$^{-3}$. The junction termination wells (35) may be positioned opposite the drift region (54) such that a portion of the well region is between said source region and the junction termination well. The P++ junction termination well (35) is doped to a level of about $1 \times 10^{19}$ cm$^{-3}$.

The N++ channel layer region (56) is doped to about $5 \times 10^{18}$ atoms/cm$^{-3}$; the N type channel layer region (57) is doped to about $1 \times 10^{16}$ atoms/cm$^{-3}$, and the remainder of the P type channel layer, i.e., the threshold voltage regulating region, maintains its original doping level as epitaxially grown within a range of between about $1 \times 10^{16}$ atoms/cm$^{-3}$ and about $5 \times 10^{16}$ atoms/cm$^{-3}$.

As noted above, it is within the scope of this invention for the new channel layer (46) to be incorporated into a MOSFET. The MOSFET (30) is formed in a semiconductor body that maintains a normally off, nonconductive status at operating temperature such that conduction from the source region (38) is minimized until a threshold voltage is applied to the MOSFET. Until the voltage on the control contact, or gate (45), reaches the threshold voltage, the carriers from the source region (38) are restrained from conduction by at least one well region (33, 34) having an opposite conductivity type as the source region (38). This new MOSFET structure includes the channel layer (46) described above to electrically connect the source region (38) to a conductive region (54) within the semiconductor body. A first channel layer region (56) is positioned within the channel layer (46) and has the same conductivity type as the source region (38), though the doping levels of the source and the divided regions may vary as necessary for optimal design and performance. This first channel layer region (56) extends across at least a portion of the source region (38) and is preferably positioned atop the source region (38).

One aspect of the invention herein is that the channel layer (46) includes regions (56, 57, 58, and 60) having varying doping types and doping levels. One of these regions serves as a threshold voltage regulating region (58), described above as a P type channel layer region. The threshold voltage regulating region is located within the channel layer (46) and has the opposite conductivity type as the source region (38) to control the threshold voltage that allows conduction across the channel layer (46). The threshold voltage regulating region (58) is positioned adjacent the first divided channel region (56) and extends across at least a portion of the well region (33) that surrounds the source region (38).

It is important to recall that the channel layer (46) may be an epitaxially grown P type layer, and the various divided regions therein are doped by standard methods to create N and N++ regions as desirable to control conduction through the MOSFET. The conduction is ultimately controlled by a gate contact (45) located on the channel layer with the capability to invert a p type portion (58) of the channel layer (46).

In forming a MOSFET according to this invention, the design parameters described above are all available for incorporating into the MOSFET. These parameters such as doping type, doping level, doping profile, positions of particular regions, and other factors will not be repeated but are incorporated herein as if fully set forth again. For convenience, the terms "P type channel layer region" and "threshold voltage regulating region" are equivalents and are shown in FIG. 2 as the P type region (58) of the channel layer (46).

The overall invention is useful in forming a MOSFET (30) that will reliably remain in the nonconductive state until a threshold voltage is applied to the gate (45). The MOSFET is particularly adept at providing a controlled current at a threshold voltage (and no current below the threshold voltage) for operating temperatures ranging from −50° C. to 200° C. This is due in part to having a P type channel layer (46) epitaxially grown over at least portions of both (i) a source region (38) and (ii) a well region (33, 34) that at least partially surrounds the source region (38). As noted previously, a first channel layer region (56) is positioned within the channel layer and covers at least a portion of the source region (38). This first channel layer region (56) is sufficiently doped so that the first channel layer region (56) is N type. A threshold voltage regulating region, described above as the P type channel layer region (58), is positioned within the channel layer (46) adjacent the first channel region (56) and extending over at least a portion of the well region (33), said threshold voltage regulating region (58) having P type conductivity to control the threshold voltage necessary to allow conduction from the source region (38) across the well region (33). As is typical in functional transistors, the MOSFET of this invention includes a control contact, or gate (45) on the channel layer (46) for controlling the current from the source across the well region.

Other devices also benefit from the channel layer (46) as set forth herein. As shown in FIG. 3, for example, an insulated gate bipolar transistor (IGBT) (65) may have a controlled threshold voltage by incorporating a channel layer (66) therein with sections (70, 71, 72, 73) of different doping characteristics. The IGBT (65) of this invention includes an emitter region (78) of a first conductivity type at least partially surrounded by a base region (83, 84) of opposite conductivity type, wherein the emitter region (78) is positioned between the channel layer (66) and the base region (83, 84). The IGBT (65) further includes a base contact (85) on the channel layer (66), wherein the gate contact (85) extends across the length of at least a portion of both the emitter (78) and base (83, 84) regions for controlling conduction through at least one p-n junction between the base region (83, 84) and a collector (82). The IGBT may be formed on a substrate (90) of P type conductivity to support an N− type drift region (89) under a JFET region (87) of N type conductivity. The JFET region (89) may be an epitaxial layer formed on the drift region during the manufacturing process.

The IGBT is further characterized by having a divided channel layer that incorporates sections, or regions (70, 71, 72, 73), of varying doping characteristics. In one embodiment, a first IGBT channel layer region (70) is positioned within the channel layer (66) and has the same conductivity type as the emitter region (78). The first channel layer region (70) extends across at least a portion of the emitter region (78); a threshold voltage regulating region (72) is also positioned within the channel layer (66) and has the opposite conductivity type as the emitter region (78). The threshold voltage regulating region (72) is preferably adjacent the first channel layer region (70) and extends across at least a portion of the base region (83). The threshold voltage regulating region increases the threshold voltage on the gate that is necessary to allow conduction from the source region toward the IGBT collector (82).

In addition to the device, or apparatus, embodiments described above, the method of forming the devices further exemplifies the unique nature of this invention. The method here includes forming semiconductor devices having controlled threshold voltage levels allowing conduction from a source region (38, 78), across a well region (33, 83), to a drift region (54, 89) within the body of the semiconductor device. The method includes the steps of (i) implanting at least one P type well (33, 34, 83, 84) into an N type, or N− type, semiconductor body to depths that define at least one N type source region (38, 78) at least partially surrounded by the P type well (33, 34, 83, 84); (ii) doping the N type source region (38, 78) to form an N+ type source region (38, 78); (iii) growing a P type channel layer (46, 66) over at least a portion of both said well and said source region; (iv) doping sections of said P type channel layer (46, 66) to convert the sections to N type channel layer regions (56, 57, 58, 60, 70-73), said N type channel layer regions abutting opposite sides of at least one P type section (58, 72) of the originally P type regrown channel layer (46, 66); and (v) forming a gate contact (45, 85) on the channel layer (46, 66), the gate contact at lease partially covering at least one N type channel layer region and at least one P type channel layer region. Additionally, the method may include forming an N type epitaxial JFET region (61, 87) adjacent the source region. These steps, enumerated here only for clarity, may be accomplished in other orders, with intervening steps for added efficiencies, and may utilize common techniques available for processing semiconductor materials.

The method of this invention avoids certain pitfalls resulting from process steps of the prior art. The previously known processes for forming an N type channel layer yields carrier scattering within layers of the device, and these scattered carriers affect the threshold voltage that turns on the device for conduction, i.e., the scattered carriers lower the threshold voltage and allow undesirable conduction. The scattering occurs during device fabrication steps including, but not limited to, the doping procedures, steps that vary layer thickness, misalignment in defining the channel region, or activation temperature floating, etc. The P type regrown channel layer (FIG. 2, No. 46) of this invention yields significantly less scattering and minimizes the detrimental effect on the threshold voltage, potentially enhancing device yields for mass production.

Other benefits are also evident in using a P type regrown layer (46) for forming the channel in a transistor. For example, simulation results have shown that the proposed MOSFETs with a P type regrown channel layer exhibit a much lower reverse leakage current than MOSFETs with an N type regrown channel.

The method disclosed herein for fabricating a regrown channel layer of P type semiconductor material would also be compatible for forming conventional DMOSFETs. The method of this invention, however, has the added benefit of defining the channel length solely by the features of the photo mask instead of buffered oxide etching ("BOE wet etching") used in self-alignment DMOSFET fabrication processes. This advantage can significantly ensure repeatability of the device performance and is significant for mass production.

Figure 4:
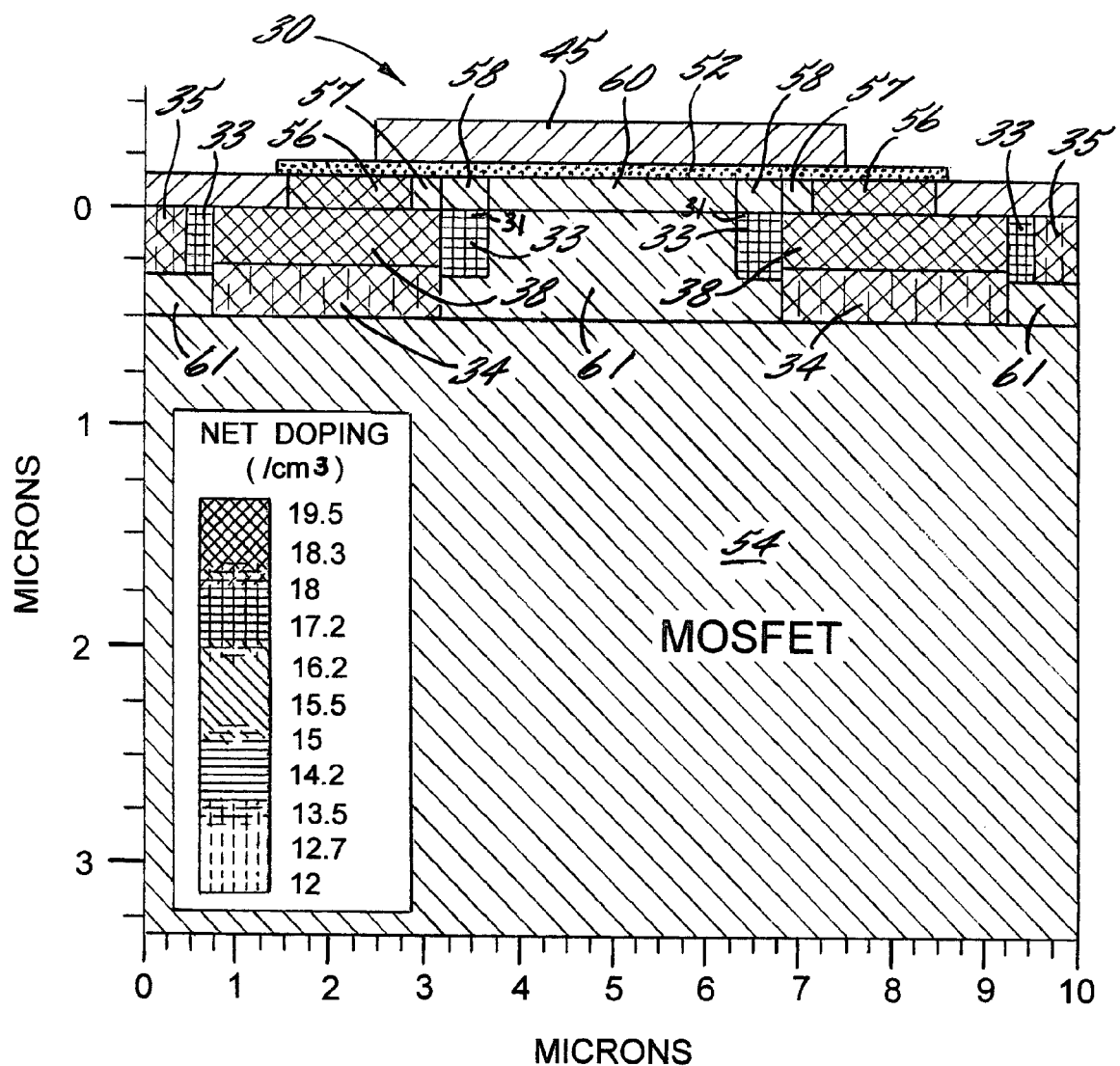
FIG. 4 is a simulated doping profile for a MOSFET formed in accordance with this invention.
Figure 5:
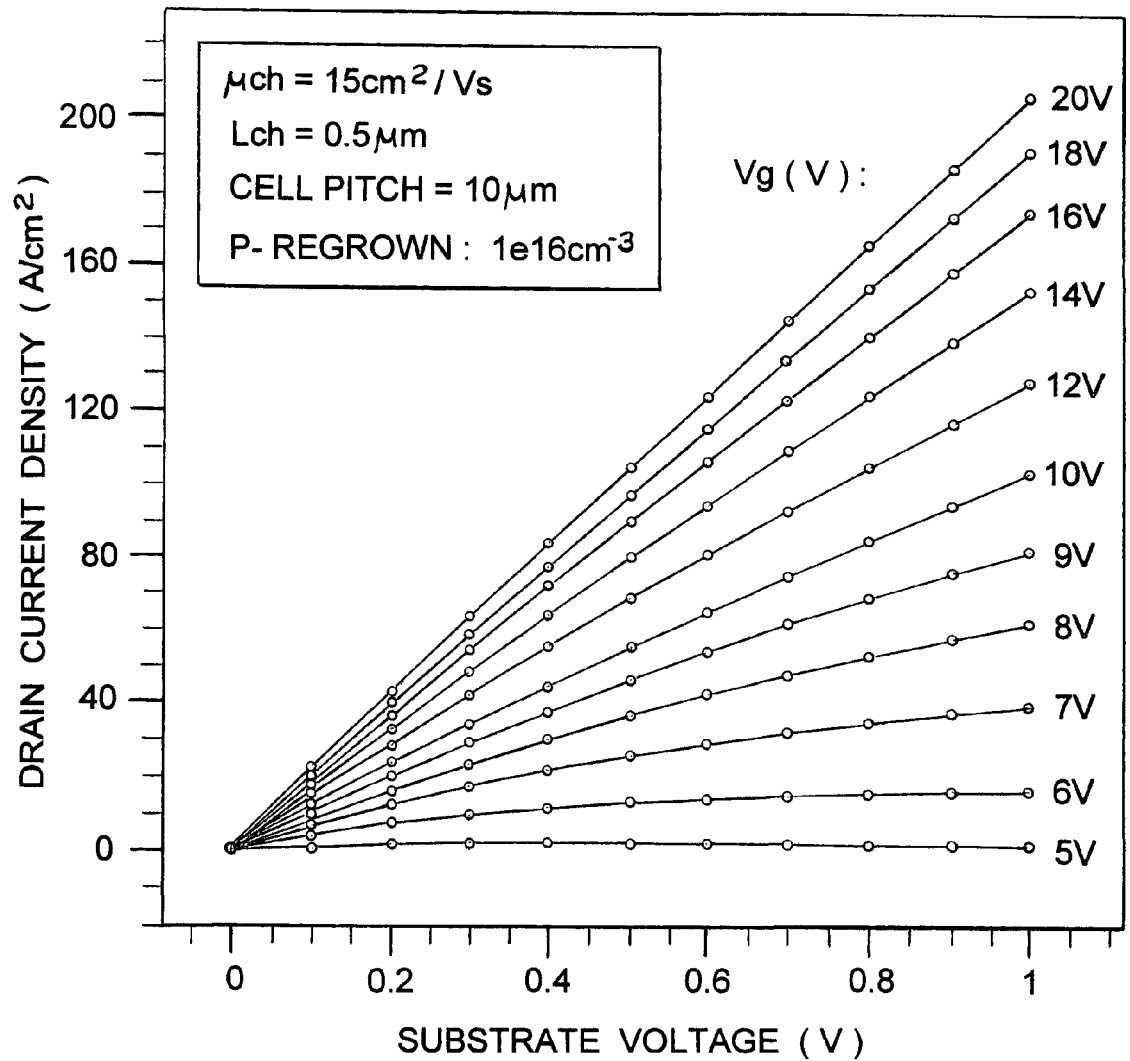
FIG. 5 is the simulated forward biased collector current response for a MOSFET formed in accordance with this invention.
Figure 6:
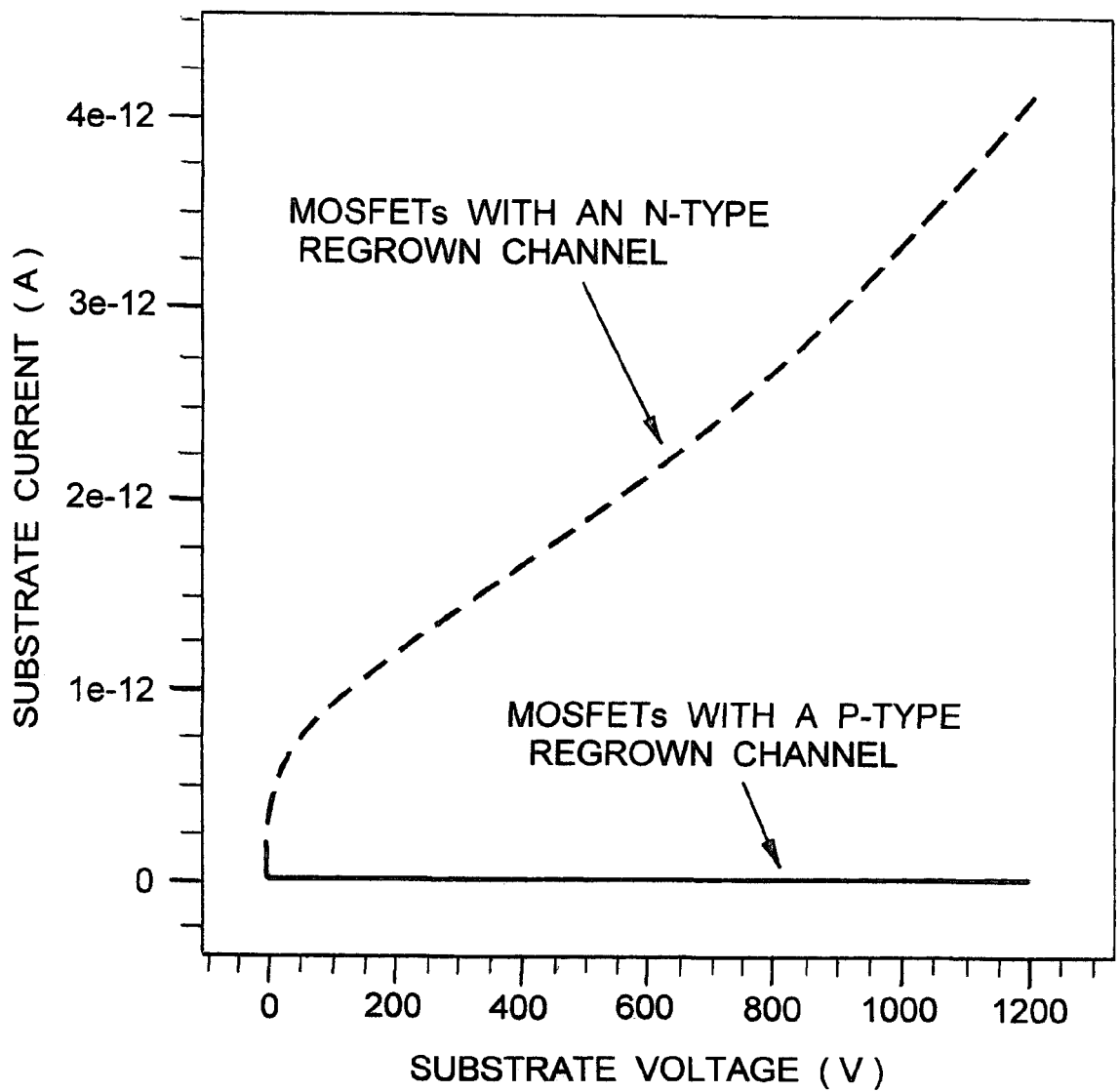
FIG. 6 is the simulated blocking characteristic profile for a MOSFET formed in accordance with this invention.

Simulated testing shows transistors formed in accordance with this invention include highly controlled current responses at a wide range of voltages and temperatures. FIG. 4 is a graphical representation of the doped semiconductor MOSFET similar to that which could be manufactured for use. The doping types would correspond to the above noted descriptions for FIG. 1 with the doping levels noted in the legend of FIG. 4. As set forth in FIG. 5, transistors with the P type regrown channel layer having varied doping profiles show a well-controlled drain current across a wide spectrum of gate and substrate voltages. Even better results follow in FIG. 6, which shows that the current response in the device formed with the P type channel of this invention is consistent at operating temperature even when the substrate voltage ranges from 0 to 1200 volts. By comparison, a transistor having an N type re-grown channel layer of the prior art rapidly loses control of its current response regardless of gate voltage.

Figure 7:
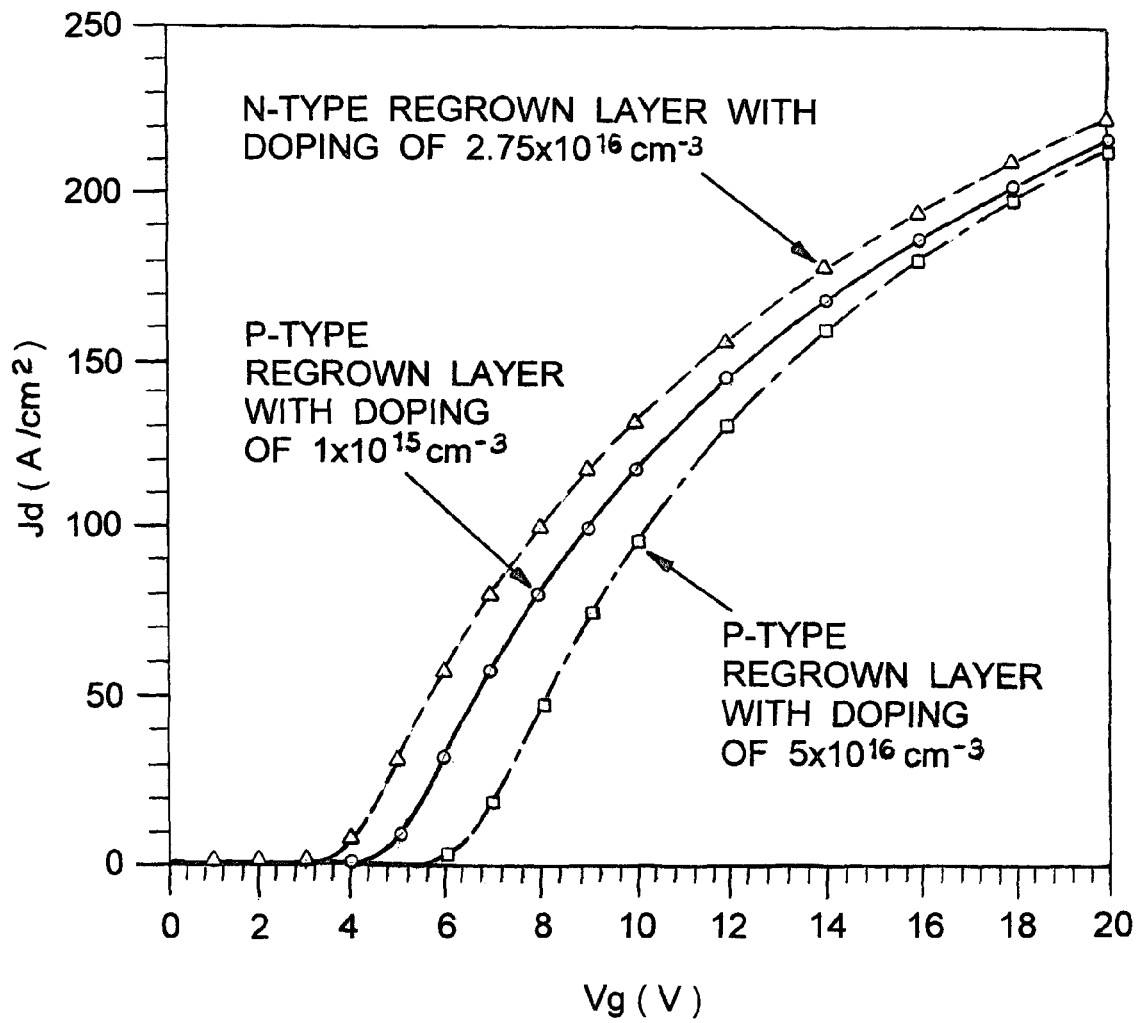
FIG. 7 is a simulated representation of transfer characteristics of MOSFETs with N type channel layers of the prior art and P type channel layers formed in accordance with this invention.

FIG. 7 is particularly telling in that a transistor having the P type regrown channel layer set forth above can achieve a threshold voltage that is about 1 volt higher than the N type channel layer of the prior art at the same operating temperature. Of course, the threshold voltage depends upon the channel layer doping level as shown in FIG. 7.

In the drawings and specification there has been set forth a preferred embodiment of the invention, and although specific terms have been employed, they are used in a generic and descriptive sense only and not for purposes of limitation, the scope of the invention being defined in the claims.

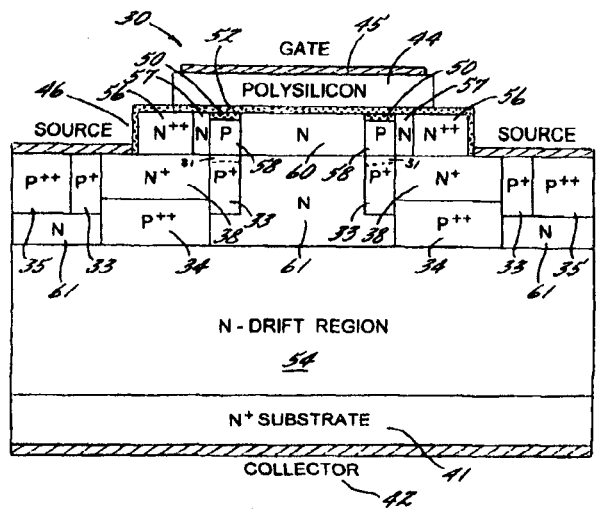

The invention claimed is:

1. A device for controlling electrical conduction across a semiconductor body, comprising:
   at least one source region having a first conductivity type within the semiconductor body;
   at least one well region having a second conductivity type and adjacent said source region to control carrier flow from said source region;
   a drift region adjacent a side of said well region opposite said source region, said drift region having said first conductivity type for providing a conductive path for carriers from said source region;
   a channel layer on at least a portion of said source, well, and drift regions, to provide a conductive path across said well region to said drift region, wherein said channel layer comprises a first channel layer region of said first conductivity type that is adjacent said source region, a second channel layer region of said second conductivity type that is adjacent said well region, and a third channel layer region of said first conductivity type that is adjacent said drift region;
   a control contact on said channel layer for controlling current from said source region across said drift region.

2. A device according to claim 1, wherein said channel layer comprises a P type epitaxial layer grown on the semiconductor body with a doping concentration between about $1 \times 10^{16}$ atoms/cm$^{-3}$ and about $5 \times 10^{16}$ atoms/cm$^{-3}$.

3. A device according to claim 1, wherein said channel layer comprises a P type epitaxial layer grown on the semiconductor body with a non-uniform doping concentration across the thickness of said channel layer.

4. A device according to claim 3, wherein said non-uniform doping concentration comprises a higher doping concentration along a boundary of said drift region than the doping concentration proximate said control contact.

5. A device according to claim 3, wherein said non-uniform doping concentration has a doping profile that is delta (δ)-shaped.

6. A device according to claim 1, wherein said well region comprises a P+ well on either side of said source region and a P++ well below said source region.

7. A device according to claim 6, further comprising an N type retrograde region at the top of said P+ well such that said N type retrograde region is between said P+ well and said channel layer.

8. A device according to claim 1, wherein doping of said channel layer is such that said second channel layer region forms a P type threshold voltage regulating portion and said first channel layer region and said third channel layer region form N type channel layer regions that are adjacent to opposite sides of said P type threshold voltage regulating portion within said channel layer.

9. A device according to claim 8, wherein said first channel layer region is doped to N++ conductivity and extends over at least a portion of said source region.

10. A device according to claim 9, wherein said third channel layer region is doped to N type conductivity in a position such that said P type threshold voltage regulating portion is between an N++ region on one side and an N type channel layer region on an opposite side.

11. A device according to claim 1, wherein said source and said well are formed in an N type epitaxial layer positioned on an N− type drift region.

12. A device according to claim 11, wherein said N− type drift region is formed on an N+ type substrate.

13. A device according to claim 1, wherein said well comprises a P+ type well section doped to a level of about $5\times10^{18}$ atoms/cm$^{-3}$ and a P++ type well section doped to a level of about $5\times10^{19}$ atoms/cm$^{-3}$.

14. The device according to claim 1, wherein a boundary between the first channel layer region and the second channel layer region and a boundary between the second channel layer region and the third channel layer region are substantially perpendicular to a boundary between said control contact and said channel layer.

15. A MOSFET that maintains a normally off status at operating temperature such that conduction from a source region is minimized until a threshold voltage is applied to the MOSFET, wherein carriers from the source region are restrained from conduction by at least one well region having an opposite conductivity type as the source region, the MOSFET comprising:
  a channel layer to electrically connect the source region to a conductive region in the MOSFET;
  a first channel layer region positioned within said channel layer and having the same conductivity type as the source region, said first channel layer region extending across a portion of the source region;
  a threshold voltage regulating region within said channel layer and having the opposite conductivity type as said source region to control a threshold voltage that allows conduction across said channel layer, said threshold voltage regulating region positioned adjacent said first channel layer region and extending across at least a portion of the well region;
  a second channel layer region within said channel layer having the same conductivity type as said source region, said second channel layer region positioned adjacent said threshold voltage regulating region opposite said first channel layer region and extending across a portion of the conductive region in the MOSFET; and
  a control contact on said channel layer for controlling current flowing from the source region through said channel layer.

16. A MOSFET according to claim 15, wherein the operating temperature is within the range of −50° C. to 200° C.

17. A MOSFET according to claim 15, wherein said channel layer comprises a P type epitaxial layer with a doping concentration between about $1\times10^{16}$ atoms/cm$^{-3}$ and about $5\times10^{16}$ atoms/cm$^{-3}$.

18. A MOSFET according to claim 15, wherein said channel layer comprises a P type epitaxial layer with a non-uniform doping concentration along the thickness of said channel layer from a portion of said channel layer proximate the conductive region of the MOSFET toward a portion of said channel layer proximate said control contact.

19. A MOSFET according to claim 18, wherein said non-uniform doping concentration comprises a higher P type doping concentration along the portion of said channel layer proximate the conductive region of the MOSFET than the P type doping concentration proximate said control contact.

20. A MOSFET according to claim 15, wherein the well region comprises a P+ well on either side of the source region and a P++ well below the source region.

21. A device according to claim 20, further comprising an n-type retrograde region at the top of said P+ well such that said N type retrograde region is between said P+ well and said channel layer.

22. A MOSFET according to claim 15, wherein said first channel layer region is doped to N++ conductivity and extends over at least a portion of the source region.

23. A MOSFET according to claim 22, wherein said second channel layer region is doped to N type conductivity in a position such that said threshold voltage regulating region of said channel layer is between said first channel layer region doped to N++ conductivity on one side and said second channel layer region doped to N type conductivity on an opposite side.

24. A MOSFET according to claim 15, wherein the well region comprises a P+ type well section doped to a level of about $5\times10^{18}$ atoms/cm$^{-3}$ and a P++ type well section doped to a level of about $5\times10^{19}$ atoms/cm$^{-3}$.

25. A MOSFET according to claim 15, wherein said first channel layer region is an N++ type channel layer region doped to about $5\times10^{18}$ atoms/cm$^{-3}$.

26. A MOSFET according to claim 15 wherein said second channel layer region is N type and doped to about $1\times10^{16}$ atoms/cm$^{-3}$.

27. The MOSFET according to claim 15, wherein a boundary between the first channel layer region and the threshold voltage regulating region and a boundary between the threshold voltage regulating region and the second channel layer region are substantially perpendicular to a boundary between said control contact and said channel layer.

28. A semiconductor device having a P type channel layer epitaxially grown over at least portions of both (i) a source region and (ii) a well region that at least partially surrounds the source region, the device comprising:
  a first channel layer region positioned within the channel layer and covering at least a portion of the source region, said first channel layer region being sufficiently doped so that said first channel layer region is N type;
  a threshold voltage regulating region positioned within the channel layer adjacent said first channel layer region and extending over at least a portion of the well region, said threshold voltage regulating region having P type conductivity to control a threshold voltage necessary to allow conduction from the source region across the well region;
  a second channel layer region within the channel layer and having N type conductivity, said second channel layer region positioned adjacent said threshold voltage regulating region opposite said first channel layer region; and
  a control contact on the channel layer for controlling current from the source across the well region.

29. A semiconductor device according to claim 28 wherein the semiconductor device is a MOS controlled thyristor.

30. The semiconductor device according to claim 28, wherein a boundary between the first channel layer region and the threshold voltage regulating region and a boundary between the threshold voltage regulating region and the second channel layer region are substantially perpendicular to a boundary between said control contact and said channel layer.

31. An IGBT having a controlled threshold gate voltage regulated by a channel layer having sections with different doping characteristics, the IGBT including a source region of a first conductivity type at least partially surrounded by a base region of opposite conductivity type, wherein the source region is positioned between the channel layer and the base region, and the IGBT further includes a gate contact on the channel layer, wherein the gate contact extends across the length of at least a portion of both the source and base regions for controlling conduction through at least one p-n junction between the base region and a collector; the IGBT comprising:

a first channel layer region positioned within the channel layer and having the same conductivity type as the source region, said first channel layer region extending across a portion of the source region;

a threshold voltage regulating region positioned within the channel layer and having an opposite conductivity type as the source region, said threshold voltage regulating region being adjacent said first channel layer region and extending across at least a portion of said base region, wherein said threshold voltage regulating region increases the threshold voltage on the gate that is necessary to allow conduction from the source region toward the IGBT collector; and a second channel layer region within the channel layer and having the same conductivity type as said source region, said second channel layer region positioned adjacent said threshold voltage regulating region opposite said first channel layer region.

32. The IGBT according to claim 31, wherein a boundary between the first channel layer region and the threshold voltage regulating region and a boundary between the threshold voltage regulating region and the second channel layer region are substantially perpendicular to a boundary between said gate contact and said channel layer.

33. A device for controlling electrical conduction across a semiconductor body, comprising:
at least one source region having a first conductivity type;
at least one well region having a second conductivity type and adjacent said source region to control carrier flow from said source region;
a drift region adjacent a side of said well region opposite said source region, said drift region having said first conductivity type for providing a conductive path for carriers from said source region;
a channel layer on at least a portion of said source, well, and drift regions, to provide a conductive path across said well region to said drift region, wherein said channel layer comprises a first channel layer region of said first conductivity type that is adjacent said source region and a second channel layer region of said second conductivity type that is adjacent said well region; and
a control contact on said channel layer for controlling current from said source region across said drift region;
wherein a boundary between the first channel layer region and the second channel layer region is substantially perpendicular to a boundary between said control contact and said channel layer.

34. A device according to claim 33, wherein the channel layer further comprises a third channel layer region of said first conductivity type that is adjacent said drift region, and said channel layer is doped such that said second channel layer region forms a P type threshold voltage regulating portion and said first channel layer region and said third channel layer region form N type channel layer regions that are adjacent to opposite sides of said P type threshold voltage regulating portion within said channel layer.

35. A device according to claim 34, wherein said first channel layer region is doped to N++ conductivity and extends over at least a portion of said source region.

36. A device according to claim 35, wherein said third channel layer region is doped to N type conductivity and extends over at least a portion of said drift region.

37. A MOSFET that maintains a normally off status at operating temperature such that conduction from a source region is minimized until a threshold voltage is applied to the MOSFET, wherein carriers from the source region are restrained from conduction by at least one well region having an opposite conductivity type as the source region, the MOSFET comprising:
a channel layer to electrically connect the source region to a conductive region in the MOSFET;
a first channel layer region positioned within said channel layer and having the same conductivity type as the source region, said first channel layer region extending across a portion of the source region;
a threshold voltage regulating region within said channel layer and having the opposite conductivity type as said source region to control a threshold voltage that allows conduction across said channel layer, said threshold voltage regulating region positioned adjacent said first channel layer region and extending across at least a portion of the well region; and
a control contact on said channel layer for controlling current flowing from the source region through said channel layer;
wherein a boundary between the first channel layer region and the threshold voltage regulating region is substantially perpendicular to a boundary between said control contact and said channel layer.

38. A MOSFET according to claim 37, wherein the channel layer further comprises a second channel layer region having the same conductivity type as the source region, and said channel layer is doped such that said threshold voltage regulating portion is doped to P type conductivity and said first channel layer region and said second channel layer region form N type channel layer regions that are adjacent to opposite sides of said threshold voltage regulating portion within said channel layer.

39. A MOSFET according to claim 38, wherein said first channel layer region is doped to N++ conductivity and extends over at least a portion of the source region.

40. A semiconductor device having a P type channel layer epitaxially grown over at least portions of both (i) a source region and (ii) a well region that at least partially surrounds the source region, the device comprising:
a first channel layer region positioned within the channel layer and covering at least a portion of the source region, said first channel layer region being sufficiently doped so that said first channel layer region is N type;
a threshold voltage regulating region positioned within the channel layer adjacent said first channel layer region and extending over at least a portion of the well region, said threshold voltage regulating region having P type conductivity to control a threshold voltage necessary to allow conduction from the source region across the well region; and
a control contact on the channel layer for controlling current from the source across the well region;
wherein a boundary between the first channel layer region and the threshold voltage regulating region is substantially perpendicular to a boundary between said control contact and said channel layer.

41. A semiconductor device according to claim 40 wherein the semiconductor device is a MOS controlled thyristor.

42. An IGBT having a controlled threshold gate voltage regulated by a channel layer having sections with different doping characteristics, the IGBT including a source region of a first conductivity type at least partially surrounded by a base region of opposite conductivity type, wherein the source region is positioned between the channel layer and the base region, and the IGBT further includes a gate contact on the channel layer, wherein the gate contact extends across the length of at least a portion of both the source and base regions for controlling conduction through at least one p-n junction between the base region and a collector; the IGBT comprising:
- a first channel layer region positioned within the channel layer and having the same conductivity type as the source region, said first channel layer region extending across a portion of the source region; and
- a threshold voltage regulating region positioned within the channel layer and having an opposite conductivity type as the source region, said threshold voltage regulating region being adjacent said first channel layer region and extending across at least a portion of said base region, wherein said threshold voltage regulating region increases the threshold voltage on the gate that is necessary to allow conduction from the source region toward the IGBT collector;

wherein a boundary between the first channel layer region and the threshold voltage regulating region is substantially perpendicular to a boundary between said gate contact and said channel layer.

* * * * *

UNITED STATES PATENT AND TRADEMARK OFFICE
CERTIFICATE OF CORRECTION

PATENT NO. : 7,795,691 B2
APPLICATION NO. : 12/019690
DATED : September 14, 2010
INVENTOR(S) : Qingchun Zhang et al.

It is certified that error appears in the above-identified patent and that said Letters Patent is hereby corrected as shown below:

In the CLAIMS, please add the following:

--43. A method of forming a semiconductor device for controlling electrical conduction across a semiconductor body, the method comprising:
 implanting a well region into said semiconductor body to depths that define a source region, said source region being of a first conductivity type and said well region being of a second conductivity type and said source region being at least partially surrounded by said well region;
 doping said source region to form a highly doped source region of the first conductivity type;
 growing a channel layer of the second conductivity type over at least a portion of both said well region and said source region;
 doping sections of said channel layer such that said channel layer comprises a first channel layer region of said first conductivity type that is adjacent to said source region, a second channel layer region of said second conductivity type that is adjacent to said well region, and a third channel layer region of said first conductivity type that is adjacent to a drift region, said drift region being formed in the semiconductor body adjacent a side of said well region opposite said source region and having said first conductivity type for providing a conductive path for carriers from said source region; and
 forming a control contact on said channel layer for controlling current from said source region across said drift region.

44. A method according to Claim 44, wherein doping sections of said channel layer comprises doping sections of said channel layer such that said second channel layer region forms a P type threshold voltage regulating portion and said first channel layer region and said third channel layer region form N type channel layer regions that are adjacent to opposite sides of said P type threshold voltage regulating portion within said channel layer.

45. A method according to Claim 45, wherein said first channel layer region is doped to N++ conductivity and extends over at least a portion of said source region.

Signed and Sealed this

Twenty-sixth Day of October, 2010

David J. Kappos
*Director of the United States Patent and Trademark Office*

46. A method according to Claim 46, wherein said third channel layer region is doped to N type conductivity in a position such that said P type threshold voltage regulating portion is between an N++ region on one side and an N type channel layer region on an opposite side.--

UNITED STATES PATENT AND TRADEMARK OFFICE
CERTIFICATE OF CORRECTION

PATENT NO. : 7,795,691 B2
APPLICATION NO. : 12/019690
DATED : September 14, 2010
INVENTOR(S) : Qingchun Zhang et al.

It is certified that error appears in the above-identified patent and that said Letters Patent is hereby corrected as shown below:

Delete the title page and substitute therefore the attached title page showing the corrected number of claims in the patent.

Column 18, line 10, in the CLAIMS, please add the following:

--43. A method of forming a semiconductor device for controlling electrical conduction across a semiconductor body, the method comprising:
    implanting a well region into said semiconductor body to depths that define a source region, said source region being of a first conductivity type and said well region being of a second conductivity type and said source region being at least partially surrounded by said well region;
    doping said source region to form a highly doped source region of the first conductivity type;
    growing a channel layer of the second conductivity type over at least a portion of both said well region and said source region;
    doping sections of said channel layer such that said channel layer comprises a first channel layer region of said first conductivity type that is adjacent to said source region, a second channel layer region of said second conductivity type that is adjacent to said well region, and a third channel layer region of said first conductivity type that is adjacent to a drift region, said drift region being formed in the semiconductor body adjacent a side of said well region opposite said source region and having said first conductivity type for providing a conductive path for carriers from said source region; and
    forming a control contact on said channel layer for controlling current from said source region across said drift region.

44. A method according to Claim 43, wherein doping sections of said channel layer comprises doping sections of said channel layer such that said second channel layer region forms a P type threshold voltage regulating portion and said first channel layer region and said third channel layer region form N type channel layer regions that are adjacent to opposite sides of said P type threshold voltage regulating portion within said channel layer.

This certificate supersedes the Certificate of Correction issued October 26, 2010.

Signed and Sealed this

Twenty-third Day of November, 2010

David J. Kappos
*Director of the United States Patent and Trademark Office*

CERTIFICATE OF CORRECTION (continued)
U.S. Pat. No. 7,795,691 B2

45. A method according to Claim 43, wherein said first channel layer region is doped to N++ conductivity and extends over at least a portion of said source region.

46. A method according to Claim 43, wherein said third channel layer region is doped to N type conductivity in a position such that said P type threshold voltage regulating portion is between an N++ region on one side and an N type channel layer region on an opposite side.--

(12) United States Patent
Zhang et al.

(10) Patent No.: US 7,795,691 B2
(45) Date of Patent: Sep. 14, 2010

(54) SEMICONDUCTOR TRANSISTOR WITH P TYPE RE-GROWN CHANNEL LAYER

(75) Inventors: Qingchun Zhang, Cary, NC (US); Sarah Haney, Apex, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 3 days.

(21) Appl. No.: 12/019,690

(22) Filed: Jan. 25, 2008

(65) Prior Publication Data
US 2009/0189228 A1 Jul. 30, 2009

(51) Int. Cl.
*H01L 29/78* (2006.01)
(52) U.S. Cl. .............. 257/402; 257/330; 257/331
(58) Field of Classification Search ........... 257/262, 257/368–401, E29.255–E29.313, E29.315–E29.316; 438/135, 151, 197, 199, 201, 207, 216
See application file for complete search history.

(56) References Cited

U.S. PATENT DOCUMENTS

| | | | |
|---|---|---|---|
| 5,905,284 | A | 5/1999 | Fujii et al. |
| 6,365,932 | B1 | 4/2002 | Kouno et al. |
| 6,455,892 | B1 * | 9/2002 | Okuno et al. ........... 257/328 |
| 6,956,238 | B2 | 10/2005 | Ryu et al. |
| 6,995,397 | B2 * | 2/2006 | Yamashita et al. ........ 257/77 |
| 7,041,559 | B2 | 5/2006 | Baliga |
| 2002/0038891 | A1 * | 4/2002 | Ryu et al. ........... 257/350 |
| 2004/0079989 | A1 | 4/2004 | Kaneko et al. |
| 2004/0084724 | A1 | 5/2004 | Kapels et al. |
| 2006/0270103 | A1 | 11/2006 | Das et al. |
| 2007/0018199 | A1 * | 1/2007 | Sheppard et al. ........ 257/200 |
| 2007/0138548 | A1 * | 6/2007 | Kocon et al. ........... 257/336 |

FOREIGN PATENT DOCUMENTS

| | | |
|---|---|---|
| EP | 0 653 786 A2 | 5/1995 |
| EP | 0 744 769 A2 | 11/1996 |
| EP | 0 789 401 A2 | 8/1997 |
| EP | 1 286 398 | 2/2003 |
| JP | 20011094097 | 4/2001 |
| WO | WO 0229900 A2 | 4/2002 |

OTHER PUBLICATIONS

European Search Report of counterpart application No. EP 09151203.8 mailed Aug. 19, 2009; 2 pages.

* cited by examiner

*Primary Examiner*—Wai-Sing Louie
*Assistant Examiner*—Sue Tang
(74) *Attorney, Agent, or Firm*—Withrow & Terranova, P.L.L.C.

(57) ABSTRACT

The invention is a device for controlling conduction across a semiconductor body with a P type channel layer between active semiconductor regions of the device and the controlling gate contact. The device, often a MOSFET or an IGBT, includes at least one source, well, and drift region. The P type channel layer may be divided into sections, or divided regions, that have been doped to exhibit N type conductivity. By dividing the channel layer into regions of different conductivity, the channel layer allows better control over the threshold voltage that regulates current through the device. Accordingly, one of the divided regions in the channel layer is a threshold voltage regulating region. The threshold-voltage regulating region maintains its original P type conductivity and is available in the transistor for a gate voltage to invert a conductive zone therein. The conductive zone becomes the voltage regulated conductive channel within the device.

46 Claims, 7 Drawing Sheets

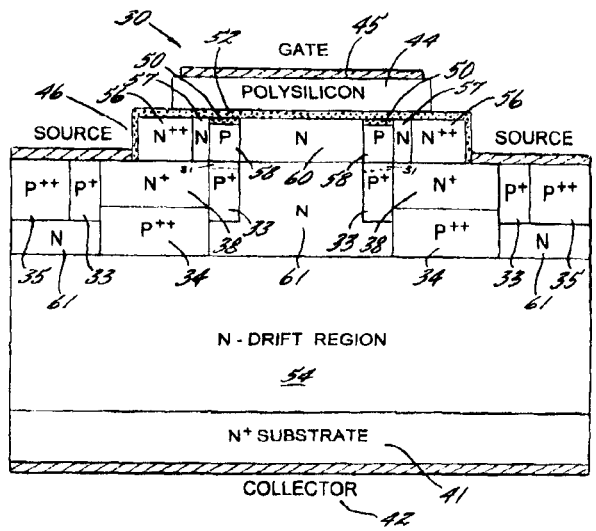

UNITED STATES PATENT AND TRADEMARK OFFICE
CERTIFICATE OF CORRECTION

PATENT NO. : 7,795,691 B2
APPLICATION NO. : 12/019690
DATED : September 14, 2010
INVENTOR(S) : Qingchun Zhang et al.

It is certified that error appears in the above-identified patent and that said Letters Patent is hereby corrected as shown below:

Delete the title page and substitute therefore the attached title page showing the corrected number of claims in the patent.

Column 18, line 10, in the CLAIMS, please add the following:

--43. A method of forming a semiconductor device for controlling electrical conduction across a semiconductor body, the method comprising:
  implanting a well region into said semiconductor body to depths that define a source region, said source region being of a first conductivity type and said well region being of a second conductivity type and said source region being at least partially surrounded by said well region;
  doping said source region to form a highly doped source region of the first conductivity type;
  growing a channel layer of the second conductivity type over at least a portion of both said well region and said source region;
  doping sections of said channel layer such that said channel layer comprises a first channel layer region of said first conductivity type that is adjacent to said source region, a second channel layer region of said second conductivity type that is adjacent to said well region, and a third channel layer region of said first conductivity type that is adjacent to a drift region, said drift region being formed in the semiconductor body adjacent a side of said well region opposite said source region and having said first conductivity type for providing a conductive path for carriers from said source region; and
  forming a control contact on said channel layer for controlling current from said source region across said drift region.

44. A method according to Claim 43, wherein doping sections of said channel layer comprises doping sections of said channel layer such that said second channel layer region forms a P type threshold voltage regulating portion and said first channel layer region and said third channel layer region form N type channel layer regions that are adjacent to opposite sides of said P type threshold voltage regulating portion within said channel layer.

This certificate supersedes the Certificates of Correction issued October 26, 2010 and November 23, 2010.

Signed and Sealed this

Fourteenth Day of December, 2010

David J. Kappos
*Director of the United States Patent and Trademark Office*

45. A method according to Claim 44, wherein said first channel layer region is doped to N++ conductivity and extends over at least a portion of said source region.

46. A method according to Claim 45, wherein said third channel layer region is doped to N type conductivity in a position such that said P type threshold voltage regulating portion is between an N++ region on one side and an N type channel layer region on an opposite side.--

CERTIFICATE OF CORRECTION (continued)

(12) United States Patent
Zhang et al.

(10) Patent No.: US 7,795,691 B2
(45) Date of Patent: Sep. 14, 2010

(54) SEMICONDUCTOR TRANSISTOR WITH P TYPE RE-GROWN CHANNEL LAYER

(75) Inventors: Qingchun Zhang, Cary, NC (US); Sarah Haney, Apex, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 3 days.

(21) Appl. No.: 12/019,690

(22) Filed: Jan. 25, 2008

(65) Prior Publication Data
US 2009/0189228 A1 Jul. 30, 2009

(51) Int. Cl.
*H01L 29/78* (2006.01)

(52) U.S. Cl. ............... 257/402; 257/330; 257/331

(58) Field of Classification Search ............... 257/262, 257/368–401, E29.255–E29.313, E29.315–E29.316; 438/135, 151, 197, 199, 201, 207, 216
See application file for complete search history.

(56) References Cited

U.S. PATENT DOCUMENTS

| | | | |
|---|---|---|---|
| 5,905,284 | A | 5/1999 | Fujii et al. |
| 6,365,932 | B1 | 4/2002 | Kouno et al. |
| 6,455,892 | B1 * | 9/2002 | Okuno et al. ............ 257/328 |
| 6,956,238 | B2 | 10/2005 | Ryu et al. |
| 6,995,397 | B2 * | 2/2006 | Yamashita et al. ............ 257/77 |
| 7,041,559 | B2 | 5/2006 | Baliga |
| 2002/0038891 | A1 * | 4/2002 | Ryu et al. ............ 257/350 |
| 2004/0079989 | A1 | 4/2004 | Kaneko et al. |
| 2004/0084724 | A1 | 5/2004 | Kapels et al. |
| 2006/0270103 | A1 | 11/2006 | Das et al. |
| 2007/0018199 | A1 * | 1/2007 | Sheppard et al. ............ 257/200 |
| 2007/0138548 | A1 * | 6/2007 | Kocon et al. ............ 257/336 |

FOREIGN PATENT DOCUMENTS

| | | |
|---|---|---|
| EP | 0 653 786 A2 | 5/1995 |
| EP | 0 744 769 A2 | 11/1996 |
| EP | 0 789 401 A2 | 8/1997 |
| EP | 1 286 398 | 2/2003 |
| JP | 2001094097 | 4/2001 |
| WO | WO 0229900 A2 | 4/2002 |

OTHER PUBLICATIONS

European Search Report of counterpart application No. EP 09151203.8 mailed Aug. 19, 2009; 2 pages.

* cited by examiner

*Primary Examiner*—Wai-Sing Louie
*Assistant Examiner*—Sue Tang
(74) *Attorney, Agent, or Firm*—Withrow & Terranova, P.L.L.C.

(57) ABSTRACT

The invention is a device for controlling conduction across a semiconductor body with a P type channel layer between active semiconductor regions of the device and the controlling gate contact. The device, often a MOSFET or an IGBT, includes at least one source, well, and drift region. The P type channel layer may be divided into sections, or divided regions, that have been doped to exhibit N type conductivity. By dividing the channel layer into regions of different conductivity, the channel layer allows better control over the threshold voltage that regulates current through the device. Accordingly, one of the divided regions in the channel layer is a threshold voltage regulating region. The threshold-voltage regulating region maintains its original P type conductivity and is available in the transistor for a gate voltage to invert a conductive zone therein. The conductive zone becomes the voltage regulated conductive channel within the device.

46 Claims, 7 Drawing Sheets